United States Patent
Ogisu et al.

(10) Patent No.: US 10,259,197 B2
(45) Date of Patent: Apr. 16, 2019

(54) DECORATIVE PRODUCT AND METHOD OF MANUFACTURING DECORATIVE PRODUCT

(71) Applicant: TOYODA GOSEI CO., LTD., Kiyosu-shi, Aichi-ken (JP)

(72) Inventors: Motoshi Ogisu, Kiyosu (JP); Shintarou Okawa, Kiyosu (JP)

(73) Assignee: TOYODA GOSEI CO., LTD., Aichi-pref. (JP)

(*) Notice: Subject to any disclaimer, the term of this patent is extended or adjusted under 35 U.S.C. 154(b) by 14 days.

(21) Appl. No.: 15/551,984

(22) PCT Filed: Mar. 11, 2016

(86) PCT No.: PCT/JP2016/057789
§ 371 (c)(1),
(2) Date: Aug. 18, 2017

(87) PCT Pub. No.: WO2016/158320
PCT Pub. Date: Oct. 6, 2016

(65) Prior Publication Data
US 2018/0029333 A1 Feb. 1, 2018

(30) Foreign Application Priority Data
Mar. 31, 2015 (JP) ................. 2015-071664

(51) Int. Cl.
*B32B 27/16* (2006.01)
*B32B 27/30* (2006.01)
(Continued)

(52) U.S. Cl.
CPC ............ *B32B 15/082* (2013.01); *B32B 27/30* (2013.01); *B32B 27/308* (2013.01); *C23C 14/02* (2013.01);
(Continued)

(58) Field of Classification Search
CPC .............................. C23C 14/022; C23C 14/20
See application file for complete search history.

(56) References Cited

U.S. PATENT DOCUMENTS

| 3,686,018 A * | 8/1972 | Lindblom et al. ....... C08J 7/123 |
| | | 427/322 |
| 6,328,358 B1 | 12/2001 | Berweiler |
| 2015/0146287 A1 | 5/2015 | Kuhlmann et al. |

FOREIGN PATENT DOCUMENTS

| DE | 10304668 A1 * | 8/2004 | ............. B05D 5/067 |
| EP | 1 560 289 A2 | 8/2005 | |

(Continued)

OTHER PUBLICATIONS

Machine translation of DE 10304668A1 (Year: 2004).*
(Continued)

*Primary Examiner* — Ramsey Zacharia
(74) *Attorney, Agent, or Firm* — Posz Law Group, PLC

(57) ABSTRACT

A decorative product includes a transparent member formed from an acrylic resin and a decorative layer arranged on a rear surface of the transparent member. A processed layer is located between the transparent member and the decorative layer. The processed layer is formed by performing a plasma treatment on the rear surface of the transparent member. The decorative layer is a metal layer formed on the processed layer formed by performing sputtering. The processed layer has the thickness L of less than or equal to 260 nm.

4 Claims, 1 Drawing Sheet

(51) Int. Cl.
  *C23C 14/02* (2006.01)
  *C23C 14/20* (2006.01)
  *B32B 15/082* (2006.01)
  *C23C 14/06* (2006.01)

(52) U.S. Cl.
  CPC .......... *C23C 14/06* (2013.01); *C23C 14/205* (2013.01); *B32B 27/16* (2013.01); *B32B 2307/412* (2013.01); *B32B 2309/105* (2013.01); *B32B 2451/00* (2013.01); *C23C 14/022* (2013.01); *C23C 14/20* (2013.01)

(56) References Cited

FOREIGN PATENT DOCUMENTS

| | | |
|---|---|---|
| JP | H01-263954 A | 10/1989 |
| JP | H04-17660 A | 1/1992 |
| JP | H04-204502 A | 7/1992 |
| JP | H04-325941 A | 11/1992 |
| JP | H06-289206 A | 10/1994 |
| JP | 2000-103883 A | 4/2000 |
| JP | 2000-103884 A | 4/2000 |
| JP | 2000-159039 A | 6/2000 |
| JP | 2001-123263 A | 5/2001 |
| WO | 2013/178563 A2 | 12/2013 |

OTHER PUBLICATIONS

International Preliminary Report on Patentability dated Oct. 3, 2017 issued in corresponding International application No. PCT/JP2016/057789.

International Search Report of the International Searching Authority dated Apr. 19, 2016 issued in the corresponding International application No. PCT/JP2016/057789(and English translation).

Extended EP Search Report dated Oct. 29, 2018 issued in corresponding EP patent application No. 16772204.0.

* cited by examiner

Fig.1A
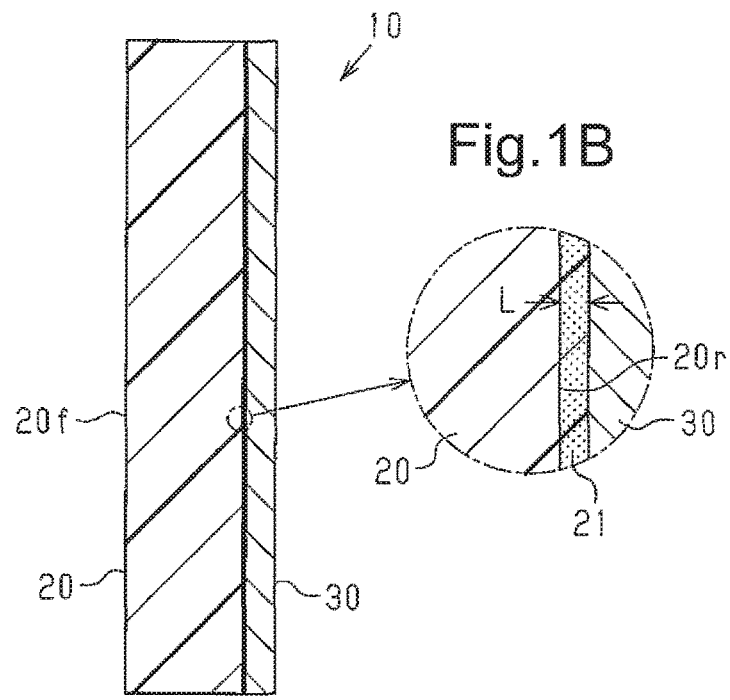
Fig.1B
Fig.2
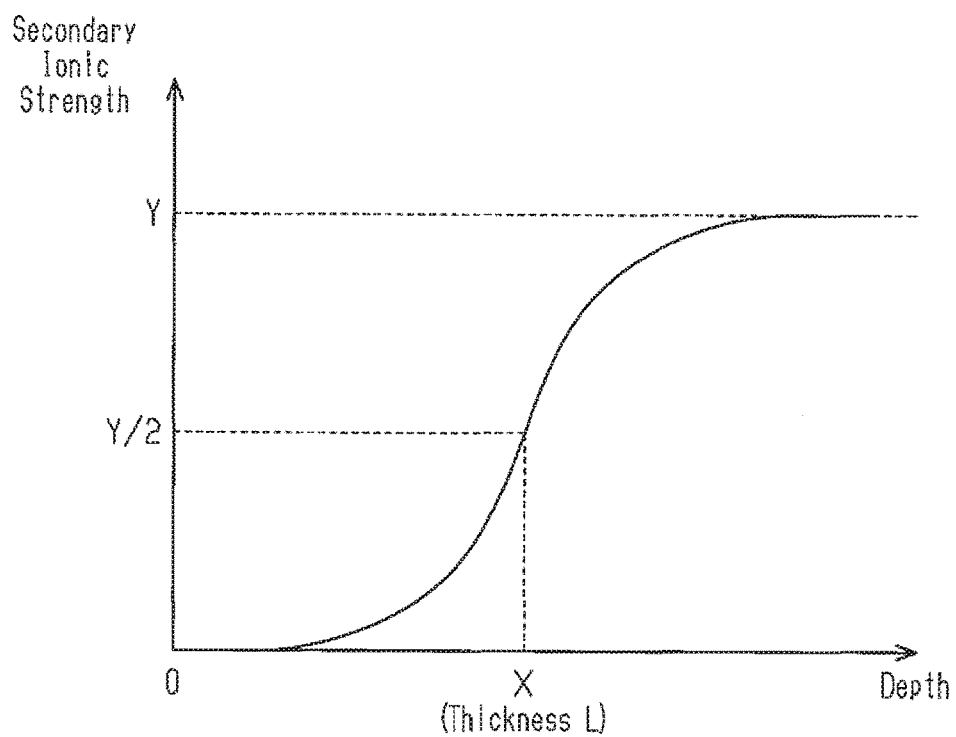

DECORATIVE PRODUCT AND METHOD OF MANUFACTURING DECORATIVE PRODUCT

CROSS REFERENCE TO RELATED APPLICATIONS

This application is a U.S. national stage application of International Application No. PCT/JP2016/057789 filed on Mar. 11, 2016, which is based on and claims priority to Japanese Patent Application No. 2015-071664 filed on Mar. 31, 2015, the disclosures of which are incorporated herein by reference.

TECHNICAL FIELD

The present invention relates to a decorative product including a transparent member, which is formed from an acrylic resin, and a decorative layer arranged on a first surface of the transparent member so that the decorative layer is visually recognized through the transparent member and to a method for manufacturing the decorative product.

BACKGROUND ART

In interior and exterior products for vehicles, there has been a high demand for a decorative product including a decorative layer on a first surface (for example, rear surface) of a transparent member so that the decorative layer is visually recognized through the transparent member from a surface (for example, front surface) opposite to the first surface. For example, in a vehicle in which a millimeter radar device is installed, such a decorative product is applied to a radio wave transmission cover used as an emblem portion, which is located in front of the millimeter radar device. Patent document 1 discloses a radio wave transmission cover including a metal film (decorative layer), which is formed by vapor-depositing metal such as indium, and a colored layer such as a black layer on the rear surface of the transparent member, which is formed from a resin material. Such a decorative product obtains a three-dimensional, unique aesthetic appeal as compared to a decorative product including a decorative layer on a front surface of a base.

Further, patent document 2 discloses a technique in which when forming a metal film by performing sputtering on a surface of a base formed from an acrylic resin, the adhesion of the metal film to the base is increased by forming the metal film while performing a plasma treatment in an inert gas atmosphere.

PRIOR ART DOCUMENT

Patent Documents

Patent Document 1: Japanese Laid-Open Patent Publication No. 2000-159039

Patent Document 2: Japanese Laid-Open Patent Publication No. 4-204502

SUMMARY OF THE INVENTION

Problems that are to be Solved by the Invention

It is preferred that an acrylic resin be used for a transparent member forming a decorative product such as a radio wave transmission cover from the viewpoint of weather resistance, scratch resistance, and the like. Thus, the technique of patent document 2 was used to manufacture a decorative product by forming a decorative layer by performing sputtering on a transparent member formed from an acrylic resin. However, there were cases in which the color tone of the decorative layer changed in an unexpected manner. More specifically, there were cases in which the color tone of the decorative layer became yellower than the original color tone when the decorative product was viewed from the transparent member.

It is an object of the present invention to provide a decorative product that includes a decorative layer formed by performing sputtering on a transparent member formed from an acrylic resin and limits changes in the color tone of a decorative layer when viewed from the transparent member.

Means for Solving the Problem

A decorative product that solves the above problem includes a transparent member formed from an acrylic resin and a decorative layer arranged on a first surface of the transparent member. The decorative layer is visually recognized through the transparent member. A processed layer is located between the transparent member and the decorative layer. The processed layer is formed by performing a plasma treatment on the first surface of the transparent member. The decorative layer is a metal layer formed on the processed layer formed by performing sputtering. The processed layer has a thickness of less than or equal to 260 nm.

It is preferred that the thickness of the processed layer be from 90 nm to 260 nm.

It is preferred that the processed layer be a layer having a structure of diamond-like carbon.

A first aspect of a method for manufacturing a decorative product including a transparent member formed from an acrylic resin and a decorative layer arranged on a first surface of the transparent member is provided. The decorative layer is visually recognized through the transparent member. The method includes the steps of forming a processed layer on the first surface of the transparent member by performing a plasma treatment and forming the decorative layer on the processed layer of the transparent member by performing sputtering after the step of forming the processed layer. The step of forming the processed layer includes performing a treatment for exposing the transparent member to oxygen after a plasma treatment using inert gas.

The manufacturing method increases the adhesion, in particular, long-term adhesion, between the transparent member and the decorative layer.

A second aspect of a method for manufacturing the decorative product is provided. The method includes the steps of forming the processed layer on the first surface of the transparent member by performing a plasma treatment and forming the decorative layer on the processed layer of the transparent member by performing sputtering after the step of forming the processed layer. The step of forming the processed layer includes performing a treatment for exposing the transparent member to oxygen after a plasma treatment using inert gas.

In a decorative product including a decorative layer on a transparent member formed from an acrylic resin by performing sputtering, the color tone of the decorative layer changes when a processed layer is arranged on the transparent member. This is because the decorative layer looks different when the decorative layer is viewed from the transparent member including the processed layer. That is, the formation of the processed layer decreases the transparency of light of the transparent member and changes the color of the transparent member. As a result, when the decorative layer is viewed through the transparent member, the color tone of the decorative layer looks different. In the present invention, the thickness of the processed layer on the transparent member is set to be less than or equal to 260 nm. This limits changes in the color tone of the decorative layer that would occur when the processed layer is arranged on the transparent member.

Effect of the Invention

The decorative product and the method for manufacturing the decorative product of the present invention limits changes in the color tone of the decorative layer that is viewed from the transparent member.

BRIEF DESCRIPTION OF THE DRAWINGS

FIG. 1A is a cross-sectional view showing a decorative product.

FIG. 1B is a partial enlarged cross-sectional view showing the decorative product.

FIG. 2 is a graph showing the relationship of a depth from a surface (rear surface) of a transparent member and a secondary ionic strength of a fragment of an acrylic resin obtained through a TOF-SIMS analysis in the depth.

EMBODIMENTS OF THE INVENTION

A decorative product according to one embodiment of the present invention will now be described.

As shown in FIGS. 1A and 1B, a decorative product 10 includes a transparent member 20 including a first surface and a second surface, which is located at the opposite side of the first surface, and a decorative layer 30 sputtered onto the first surface of the transparent member 20. In the following description, the first surface of the transparent member 20 is referred to as the rear surface 20r, and the second surface of the transparent member 20 is referred to as the front surface 20f.

The transparent member 20 is a transparent or translucent member formed from an acrylic resin. When the decorative product 10 is viewed from the transparent member 20, the decorative layer 30 is visually recognized. As long as the transparent member 20 includes the front surface 20f or the rear surface 20r, the shape of the transparent member 20 is not particularly limited and may be set in accordance with the application of the decorative product 10. For example, at least one of the front surface 20f and the rear surface 20r of the transparent member 20 may be curved or have irregularities.

A known acrylic resin such as a polymer including alkyl methacrylate, a polymer including alkyl acrylate, or a polymer including alkyl methacrylate and alkyl acrylate can be used as an acrylic resin that forms the transparent member 20. Examples of the acrylic resin include polymethyl methacrylate (PMA) and polymethyl acrylate. Each of the polymers may be a copolymer that partially includes other monomers excluding alkyl methacrylate and alkyl acrylate. Examples of the other monomers include a compound including a vinyl group, a vinylene group, or a vinylidene group such as butene, isobutene, acrylamide, methacrylamide, styrene, acrylonitrile, and methacrylonitrile. Further, the degree of polymerization is not particularly limited and may range, for example, from 10000 to 15000.

As shown in FIG. 1B, the transparent member 20 includes a processed layer 21 serving as a surface layer on the rear surface 20r including the decorative layer 30. The processed layer 21 is a layered portion arranged to increase the adhesion between the transparent member 20 and the decorative layer 30. The processed layer 21 is formed by performing a plasma treatment on the transparent member 20.

In the plasma treatment, a source gas supplied to a vacuum is ionized by plasma, and ions of the source gas are irradiated on the transparent member 20. The thickness L of the processed layer 21 on the surface of the transparent member 20 can be adjusted by adjusting the irradiation time of the ions in the plasma treatment and the power that accelerates the ions toward the transparent member 20. Examples of the source gas used for the plasma treatment include inert gas such as argon and nitrogen, oxygen, hydrogen, and mixture gas of oxygen and hydrogen. A known method of a plasma treatment (for example, method disclosed in patent document 2) can be performed as the plasma treatment.

In particular, it is preferred that after performing the plasma treatment using inert gas as source gas, a treatment of exposing the transparent member 20 to oxygen be performed as a treatment of forming the processed layer 21 based on the plasma treatment. Examples of the treatment of exposing the transparent member 20 to oxygen include performing a second plasma treatment using oxygen as source gas and leaving the transparent member 20 under an oxygen atmosphere (for example, in air). This increases the adhesion, in particular, long-term adhesion, between the transparent member 20 and the decorative layer 30.

The result of analysis with Time-of-Flight Secondary Ion Mass Spectrometry (TOF-SIMS) indicates that the processed layer 21 formed by performing a plasma treatment is a carbon layer formed when the molecular structure of the acrylic resin of the transparent member 20 changes. That is, the analysis of the processed layer 21 using TOF-SIMS allows for checking of the loss of the peak of $C_8H_{13}O_2$ and $C_9H_{13}O_4$ or the like, which is a fragment unique to an acrylic resin, and the formation of the peak of carbon, which is similar to diamond-like carbon. The result indicates that the processed layer 21 is a layer formed when the molecular structure of the acrylic resin changes and is a layer of amorphous carbon having a structure of diamond-like carbon.

The thickness L of the processed layer M is less than or equal to 260 nm and is preferably less than or equal to 160 nm. Further, the lower limit value of the thickness L of the processed layer 21 is not particularly limited and is preferably, for example, greater than or equal to 90 nm. When the processed layer 21 is thick, the adhesion between the transparent member 20 and the decorative layer 30 tends to increase.

The thickness L of the processed layer M is defined as follows. The relationship of the depth from the rear surface 20r of the transparent member 20 and the secondary ionic strength of a fragment of an acrylic resin (for example, $C_8H_{13}O_2$) obtained from the TOF-SIMS analysis in the depth is shown by the S-shaped curve in FIG. 2. In the curve of FIG. 2, the secondary ionic strength is constant subsequent to a predetermined depth. In the curve, the depth (X) when the secondary ionic strength is one-half (Y/2) of the constant value (Y) of the secondary ionic strength subsequent to the predetermined depth is set to the thickness L of the processed layer 21. When assuming that the portion of the processed layer 21 of the transparent member 20 is formed from an acrylic resin in the TOF-SIMS analysis, the value of the depth of the transparent member 20 used for the graph of FIG. 2 is an acrylic resin converted value obtained based on an etching speed of an acrylic resin.

The decorative layer 30 is a metal layer arranged on the rear surface 20r of the transparent member 20. The decorative layer 30 is formed on the processed layer 21 of the transparent member 20 by performing sputtering on which a plasma treatment is performed. The metal of the decorative layer 30 includes known metal applicable to sputtering, for example, chrome, aluminum, indium, titanium, gold, silver, copper, and platinum. Further, the color tone of the metal layer is not particularly limited.

The decorative product 10 of the present embodiment is applicable to various usages, for example, interior and exterior products for vehicles, interior and exterior components of a house or the like, and home appliances. Examples of the interior and exterior products for vehicles include an emblem and a back panel serving as a cover of a millimeter radar device.

The operation of the present embodiment will now be described.

In a decorative product including a decorative layer on a transparent member formed from an acrylic resin by performing sputtering, the color tone of the decorative layer changes when a processed layer is arranged on the transparent member. This is because the decorative layer looks different when the decorative layer is viewed from the transparent member including the processed layer. That is, the formation of the processed layer decreases the transparency of light of the transparent member and changes the color of the transparent member. As a result, when the decorative layer is viewed through the transparent member, the color tone of the decorative layer looks different.

The decorative product 10 of the present embodiment includes the processed layer 21. However, the thickness of the processed layer 21 is less than or equal to 260 nm. This limits changes in the color tone of the decorative layer 30 that would occur when the decorative product 10 is viewed from the transparent member 20.

The present embodiment has the advantages described below.

(1) The decorative product 10 includes the transparent member 20 formed from an acrylic resin and the decorative layer 30 arranged on the rear surface 20r of the transparent member 20. The processed layer 21 formed by performing a plasma treatment on the rear surface 20r (first surface) of the transparent member 20 is arranged between the transparent member 20 and the decorative layer 30. The decorative layer 30 is a metal layer formed on the processed layer 21 by performing sputtering. The thickness L of the processed layer 21 is less than or equal to 260 nm.

In the structure, the decorative layer 30 formed by performing sputtering is arranged on the processed layer 21 of the transparent member 20. This ensures the adhesion between the transparent member 20 and the decorative layer 30. Further, the processed layer 21 has a thickness of less than or equal to 260 nm. This limits changes in the color tone of the decorative layer 30 that would occur when the decorative product 10 is viewed from the transparent member 20.

(2) It is preferred that the thickness of the processed layer be greater than or equal to 90 nm.

This further increases the adhesion between the transparent member 20 and the decorative layer 30.

(3) When the decorative product 10 is manufactured, it is preferred that when a plasma treatment is performed to arrange the processed layer 21 on the transparent member 20, the second plasma treatment using oxygen be performed after the first plasma treatment using inert gas is performed.

This increases the adhesion, in particular, long-term adhesion, between the transparent member 20 and the decorative layer 30.

The present embodiment may be modified as described below.

A second decorative layer may be arranged on the front surface 20f (second surface) of the transparent member 20. For example, when using a decorative layer that at least partially includes a transparent or translucent decorative portion, the decorative layer 30 can be recognized through the decorative portion. Further, when the second decorative layer is arranged on only part of the front surface 20f (second surface) of the transparent member 20, the decorative layer 30 can be recognized through the portion where the second decorative layer is not arranged. In these cases, when the decorative layer 30 is viewed over the second decorative layer, the decorative product 10 has a further complicated color tone and aesthetic appeal.

When the second decorative layer is arranged, the processed layer 21 may also be arranged on the front surface 20f (second surface) of the transparent member 20. In this case, it is preferred that the total thickness of the two processed layers 21 be less than or equal to 260 nm.

A protection layer, a protection member, or the like that protects the decorative layer 30 may be arranged on the surface of the decorative layer 30 located at the opposite side of the transparent member 20.

EXAMPLES

Examples that further realize the embodiment will now be described.

As shown in Table 1, decorative products of a reference example and experimental examples were manufactured under different treatment conditions of a plasma treatment performed on transparent members. Further, the changes in the color tone and the adhesion of the decorative layer in each example were evaluated.

<Manufacturing of Decorative Product>

Formation of Processed layer

A transparent member (100 mm long×100 mm wide×3 mm thick) formed from PMMA was arranged at a predetermined position in a treatment chamber. The treatment chamber included two electrodes with the transparent member on the position located in between. The two electrodes were spaced apart from each other and located toward a front side and a rear side of the transparent member. After arranging the transparent member, the treatment chamber was set to a vacuum state, and the treatment chamber was supplied with a source gas converted into plasma. Then, voltage was applied to the two electrodes to generate a glow discharge, and a plasma treatment was performed on the surface (rear surface) of the transparent member. The plasma treatment was performed twice with different source gases. The first plasma treatment and the second plasma treatment were performed under the conditions described below. In the reference example, the first plasma treatment and the second plasma treatment were not performed. In experimental example 8, the second plasma treatment (treatment of exposing transparent member to oxygen) was not performed.

First Treatment Condition

Source gas: argon

Gas flow rate: 50 sccm (0° C., 1 atm (1013 hPa)

Power: 0.8 kW

Treatment time: 10 to 70 seconds

Second Treatment Condition
Source gas: oxygen
Gas flow rate: 30 sccm (0° C., 1 atm (1013 hPa)
Power: 0.5 kW
Treatment time: 10 seconds The thickness of the processed layer formed on each of the transparent members of experimental examples 1 to 4 and 8 subsequent to the plasma treatment was measured. The thickness of the processed layer was measured based on the secondary ionic strength of a fragment formed from an acrylic resin ($C_8H_{13}O_2$) using a TOF-SIMS device (TOF. SIMS5, produced by ION-TOF). The measuring condition with the TOF-SIMS device is as follows.

Primary ion source: bismuth
Measurement mode: high mass resolution
Measurement surface: analysis in depth direction
Measurement Area: 300 μm square Further, the thickness of each processed layer of the transparent member of experimental examples 5 to 7 subsequent to the plasma treatment was estimated from the thickness of each processed layer of the transparent member of experimental examples 1 to 4. More specifically, the thickness of each processed layer of experimental examples 5 to 7 was estimated from the treatment time of the plasma treatment of experimental examples 5 to 7 using an approximate line obtained by plotting on a graph the relationship of the thickness of each processed layer and the treatment time of the (first) plasma treatment in experimental examples 1 to 4.

Formation of Decorative Layer

The transparent member of each example subsequent to the plasma treatment was arranged at a predetermined position in the treatment chamber. The treatment chamber included two electrodes with the transparent member on the position located in between. The two electrodes were spaced apart from each other and located toward a front side and a rear side of the transparent member. Further, a sputtering target was arranged between the rear side of the transparent member and one of the electrodes. After arranging the transparent member, the treatment chamber was set to a vacuum state, and the treatment chamber was supplied with argon converted into plasma. Then, voltage was applied to the two electrodes to generate a glow discharge, and a decorative layer formed from a material of the sputtering target was formed on the surface (rear surface) of the transparent member. The decorative layer was formed under the following sputtering condition.

Sputtering target: aluminum
Power: 0.5 kW
Treatment time: 30 seconds

<Evaluation>
Evaluation of Color Tone

The color tone (L*a*b* color system) of a side of the transparent member of the decorative product of each example was analyzed using a spectrophotometer (CM-700d, produced by Konica Minolta, Inc). Then, the b* value of the reference example less the processed layer and the b* value of each experimental example with the processed layer were compared to calculate a Δb* value, which is the degree of changes in the color tone, and the color tone of the decorative product of each experimental example was evaluated in the following three stages based on the Δb* value. The Δb* value can be calculated by subtracting the b* value of the reference example from the b* value of each experimental example. Table 1 shows the result.

In Table 1, the symbols in the evaluation column □, ○, and x indicate the values described below and mean excellent, good, poor, respectively.

□: Δb* value<2
○: 2≤Δb* value<3
x: 3≤Δb* value

Evaluation of Adhesion

After forming the decorative layer, the decorative product of each example was left for 24 hours at an atmosphere temperature of 20° C. (room temperature). Then, the adhesion of the decorative layer was measured by conducting a pull-off test in compliance with JIS K 5600-5-7 using a pull-off adhesion tester (positive test adhesion tester KH-AT-A, produced by COTEC, Ltd). Table 1 shows the result.

TABLE 1

|  | Reference Example | Experimental Example 1 | Experimental Example 2 | Experimental Example 3 | Experimental Example 4 | Experimental Example 5 | Experimental Example 6 | Experimental Example 7 | Experimental Example 8 |
| --- | --- | --- | --- | --- | --- | --- | --- | --- | --- |
| First Treatment Time (Sec) | 0 | 10 | 20 | 30 | 40 | 50 | 60 | 70 | 10 |
| Thickness of Processed Layer (nm) | 0 | 60 | 90 | 130 | 160 | 212 | 254 | 296 | 130 |
| b* value | 2.46 | 3.01 | 3.47 | 4.09 | 4.26 | 4.95 | 5.38 | 5.78 | 4.15 |
| Δb* value | — | 0.55 | 1.01 | 1.63 | 1.8 | 2.49 | 2.92 | 3.32 | 1.69 |
| Evaluation of Color Tone | — | □ | □ | □ | ○ | ○ | ○ | x | □ |
| Separation Strength (Mpa) | 0.28 | 0.94 | 1.06 | 1.13 | 1.3 | 1.53 | 1.96 | 2.05 | 0.65 |

The result shown in Table 1 confirms the correlation of the thickness of the processed layer of the transparent member and the degree of changes in the color tone (Δb* value). When one of the thickness and the degree increases, the other one increases. The result shows that the arrangement of the processed layer in the transparent member changes the color tone of the decorative layer because the decorative layer looks different when the decorative layer is viewed through the transparent member including the processed layer, not because the color tone of the decorative layer changes (for example, the color of the decorative layer changes at a portion of the decorative layer contacting the processed layer).

Thus, even when the processed layer is arranged on the transparent member, changes in the color tone of the decorative layer are limited by forming a thin processed layer. As shown in Table 1, even when a thin processed layer is formed, the effect of increasing the adhesion of the decorative layer (separation strength) by the processed layer is obtained.

When the b* value increases, the color tone shifts toward yellow. Thus, as the processed layer thickens, the transparent member becomes yellow. This may result from the structure of diamond-like carbon forming the processed layer.

The thickness of the processed layer is substantially the same in experimental example 3 and experimental example 8 in which the second plasma treatment using oxygen was not performed. However, experimental example 8 has a higher adhesion (separation strength) of the decorative layer than experimental example 3. The result confirms that the adhesion of the decorative layer can be increased by performing the second plasma treatment using oxygen, that is, the treatment of exposing the transparent member to oxygen.

DESCRIPTION OF REFERENCE CHARACTERS

10: Decorative product
20: Transparent member
21: Processed layer
30: Decorative layer

The invention claimed is:

1. A decorative product comprising:
   a transparent member formed from an acrylic resin; and
   a decorative layer arranged on a first surface of the transparent member, wherein the decorative layer is visually recognized through the transparent member, wherein
   a processed layer is located between the transparent member and the decorative layer, wherein the processed layer is formed by performing a plasma treatment on the first surface of the transparent member,
   the decorative layer is a metal layer formed on the processed layer by performing sputtering, and
   the processed layer has a thickness of less than or equal to 260 nm.

2. The decorative product according to claim 1, wherein the thickness of the processed layer is from 90 nm to 260 nm.

3. The decorative product according to claim 1, wherein the processed layer is a layer having a structure of diamond-like carbon.

4. A method for manufacturing the decorative product according to claim 1, the method comprising:
   forming the processed layer on the first surface of the transparent member by performing a plasma treatment; and
   forming the decorative layer on the processed layer of the transparent member by performing sputtering after the formation of the processed layer, wherein
   the formation of the processed layer includes performing a treatment for exposing the transparent member to oxygen after a plasma treatment using inert gas.

* * * * *